United States Patent [19]

Shiraishi et al.

[11] Patent Number: 5,362,325
[45] Date of Patent: Nov. 8, 1994

[54] APPARATUS FOR GROWING CRYSTALS IN AN ENVIRONMENT IN WHICH OPPORTUNITY FOR ACCESSING IS LIMITED

[75] Inventors: Atsushi Shiraishi; Koji Asano; Makoto Gotoh; Kotaro Oka, all of Kawasaki, Japan

[73] Assignee: Fujitsu Limited, Kanagawa, Japan

[21] Appl. No.: 171,971

[22] Filed: Dec. 23, 1993

Related U.S. Application Data

[63] Continuation of Ser. No. 34,183, Mar. 18, 1993, abandoned, which is a continuation of Ser. No. 782,199, Oct. 24, 1991, abandoned.

[30] Foreign Application Priority Data

Oct. 25, 1990 [JP] Japan .................................. 2-285898
Aug. 12, 1991 [JP] Japan .................................. 3-202040

[51] Int. Cl.$^5$ ............................................. B01D 9/00
[52] U.S. Cl. .................................... 117/201; 117/203; 117/901
[58] Field of Search .............. 156/DIG. 62, DIG. 93, 156/DIG. 113; 422/245, 247, 253; 73/435, 441

[56] References Cited

U.S. PATENT DOCUMENTS

| | | | |
|---|---|---|---|
| 4,917,707 | 4/1990 | Claramonte et al. | 156/DIG. 62 |
| 4,919,900 | 4/1990 | Martin et al. | 156/DIG. 62 |
| 5,013,531 | 5/1991 | Snyder et al. | 156/DIG. 62 |
| 5,078,975 | 1/1992 | Rhodes et al. | 156/DIG. 62 |

FOREIGN PATENT DOCUMENTS

| | | |
|---|---|---|
| 0225050 | 6/1987 | European Pat. Off. . |
| 0282403 | 9/1988 | European Pat. Off. . |
| 0314469 | 5/1989 | European Pat. Off. . |
| 0332491 | 9/1989 | European Pat. Off. . |

OTHER PUBLICATIONS

"Preliminary Investigations of Protein Crystal Growth Using The Space Shuttle"; DeLucas et al.; *Journal of Crystal Growth*, 76 (1986), pp. 683–693.

Primary Examiner—R. Bruce Breneman
Assistant Examiner—Felisa Garrett
Attorney, Agent, or Firm—Nikaido, Marmelstein, Murray & Oram

[57] ABSTRACT

A material processing apparatus includes a plurality of syringes provided detachable on a base member and containing fluids that are used for processing a material; A processing chamber is provided detachable on the base member for causing the material processing: An actuation mechanism actuates the plurality of syringes to supply the fluids in the syringes to the processing chamber; An interconnection fixture connects the plurality of syringes to the processing chamber for transporting the fluids in the plurality of syringes to the processing chamber. The plurality of syringes are provided detachable with respect to the interconnection fixture, and the processing chamber is provided detachable with respect to the interconnection fixture.

16 Claims, 15 Drawing Sheets

APPARATUS FOR GROWING CRYSTALS IN AN ENVIRONMENT IN WHICH OPPORTUNITY FOR ACCESSING IS LIMITED

This application is a continuation of application Ser. No. 08/034,183 filed Mar. 18, 1993, which is a continuation of Ser. No. 07/782,199, filed Oct. 24, 1991 now both abandoned.

BACKGROUND OF THE INVENTION

The present invention generally relates to apparatuses for growing crystals, and more particularly to the design of the apparatus used for growing a crystal from a solution under an environment in which the opportunity for accessing the apparatus is limited.

Synthesis of novel materials in space provides a new horizon in the field of semiconductor sciences, material sciences and biological sciences. Particularly, the growth of crystals in space is expected to provide a new material characterized by unique property associate with the microgravity environment in which the material was formed.

In designing the experimental apparatuses for such space experiments, one has to take into consideration various factors that characterize the space experiment such as the enormous transport cost of the experimental apparatuses to space and the limited opportunity for accessing the experimental apparatus. When the apparatus is loaded on an unmanned space vehicle such as a satellite, all the operation of the experiment has to be conducted without human intervention. Even when the apparatus is carried by a manned space vehicle such as a space station or space shuttle, the time or resource that the operator or astronaut can spare for the operation of the apparatus is generally limited. On the other hand, the experiments for processing materials generally need a considerable time, and the apparatus has to be operated continuously for a long time.

One important field of such a space experiment is the growth of protein crystals under the microgravity environment. The growth of protein crystals is an important as well as fundamental step for determining the molecular structure and for investigating the relationship between the structure and function of the protein molecules. Based upon the determination of the molecular structure, it is expected to design the proteins having a desired function. This is one of the major goals of protein engineering.

It should be noted that one needs a protein crystal of the size larger than about 0.3 mm×0.3 mm×0.3 mm for the precise determination of the molecular structure by the X-ray diffraction analysis. The growth of such a protein crystal is generally made from a solution. On the ground, such a crystallization process is inevitably accompanied with convection caused in the solution, and the repetition of the same experimental condition for obtaining the same quality of protein crystal is extremely difficult. Further, one has to take into consideration the gravitational sedimentation of the protein crystal in the solution that inevitably causes a compositional inhomogeneity in the crystal.

In view of the foregoing problems, the experiments in space for growing the protein crystals under microgravity environments attracts attention of various researchers, as such a microgravity environment does not cause the convection when growing the protein crystals. Herein, the microgravity environment is defined as the environment wherein the acceleration is generally smaller than about $10^{-2}$ G.

Generally, the growth of protein crystals is achieved by controlling the solubility of a protein solution by crystallizing agents. Such crystallizing agents include inorganic salts such as ammonium sulfate, sodium chloride, sodium phosphate, etc. as well as organic salts such as ethanol, methanol, acetone, methylpenthancliol (MPD), etc., and cause a decrease in the solubility of the protein solution. Conventionally, the growth of protein crystals has been made by various methods, some of which are listed below.

a) BATCH METHOD
   Form a mixture of the solution of a protein and a crystallizing agent. Leave the mixture for the crystallization.

b) GRADIENT METHOD
   Change the concentration of the crystallizing agent by providing a concentration gradient. Achieve an optimum crystal growth at an optimum concentration level.

c) DIALYSIS METHOD
   Separate the protein solution and the solution including crystallizing agent by a semipermeable membrane. Achieve the crystallization by transportation of water or crystallizing agent through the semipermeable membrane.

d) FREE INTERFACE DIFFUSION METHOD
   Provide the protein solution and the solution including crystallizing agent adjacent with each other to achieve the crystallization at an interface therebetween.

e) VAPOR DIFFUSION METHOD
   Provide the protein solution and the solution including crystallizing agent with a separation. Achieve the crystallization by transportation of water or crystallizing agent vapor that causes the difference in the vapor pressure between the protein solution and the solution including the crystallizing agent.

FIGS. 1 and 2 show apparatuses used conventionally in space vehicles for crystallizing protein crystals, wherein the apparatus of FIG. 1 is used for achieving the crystallization according to the batch method. The apparatus of FIG. 2, on the other hand, achieves the crystallization according to the vapor diffusion method.

Referring to FIG. 1, there is provided a block 21 forming the apparatus body, and a plurality of syringe units $1_1$, $1_2$, . . . are formed in the block 21. Each syringe unit includes a pair of opposing syringes wherein a protein solution 2 and a solution including crystallizing agent 3 are held therein respectively. Upon actuation of the syringes, the protein solution and the crystallizing agent are sent to a crystallizing chamber 4 formed between the opposing syringes, and the protein crystals crystallize in the chamber 4.

In the apparatus of FIG. 2, a plastic tube 22 is used for growing the protein crystals. As shown in FIG. 2, the protein solution 2 and the crystallizing agent 3 are held at both ends of the plastic tube, and the communication between these parts is prohibited by valves or pinch cocks $23_1$ and $23_2$. Upon releasing of the valves, the communication between the protein solution 2 and the crystallizing agent 3 is established. For example, the solution including crystallizing agent 3 absorbs water that has been vaporized from the protein solution 2 that leads to the oversaturation of the protein solution.

In any of these conventional apparatuses, there is a problem in that the entire apparatus including the block 21 or the tube 22 has to be transported into space together with the protein solution and the solution including crystallizing agent that are the object of the experiment. Thereby, the transportation cost inevitably increases. Further, in the apparatus of FIG. 1, the astronaut has to achieve the manipulation of the syringes. Thereby, considerable resource of the astronaut on the mission is wasted. This problem becomes particularly acute when there are a large number of syringe units in the block 21.

In the apparatus of FIG. 2, the actuation of the pinch cocks can be made automatic by providing an actuating mechanism. However, such a mechanism has to be provided in correspondence to each apparatus 22. Thereby, the weight of the apparatus increases inevitably. Further, these conventional apparatuses generally lack the automatic observation mechanism for automatic observation and recording of the process of crystallization. Thus, the astronaut has to spare valuable resources for checking the progress of crystallization periodically.

SUMMARY OF THE INVENTION

Accordingly, it is a general object of the present invention to provide a novel and useful material processing apparatus, wherein the foregoing problems are eliminated.

Another and more specific object of the present invention is to provide a material processing apparatus adapted for loading on space vehicles, wherein the transport cost is reduced and the resource of the operator needed for operating the apparatus is substantially reduced.

Another object of the present invention is to provide an apparatus for crystallizing a protein in a microgravity environment, wherein versatile crystal growth processes can be experimented.

Another object of the present invention is to provide an apparatus for growing a protein crystal from a protein solution, comprising a processing chamber for growing the crystal, one or more syringes for holding the protein solution and/or a solution including crystallizing agent for causing the crystallization in the solution, and transfer device communicating the syringes to the processing chamber for sending the protein solution and/or the solution including crystallizing agent to the processing chamber from respective syringes. According to the present invention, it becomes possible to operate the apparatus such that only the processing chamber is transported back to ground while using the stock of the protein solution and solution containing the agent held in the regulated temperature environment of the space station for extensive experiments. Thereby, the transport cost for the experiment is substantially reduced as compared with the conventional case in which the entire apparatus including the syringes is transported back and forth by the space shuttle.

In a preferred embodiment, there are provided a plurality of syringes for holding the protein solution and the solution containing the crystallizing agent separately, and the transfer means sends the solution of the agent and the protein solution from respective syringes along a path that merge with each other before reaching the processing chamber. According to the present embodiment, one can achieve the crystallization according to the batch method wherein a mixture of the protein solution and the solution of the crystallizing agent is supplied to the processing chamber. Further, this embodiment enables to achieve the crystallization according to the free interface diffusion method by changing the sequence of actuation of the syringes such that the protein solution is sent first to the processing chamber and the solution of the agent is sent next or vice versa. In this case, the protein solution and the solution of the crystallizing agent form an interface in the processing chamber.

In another preferred embodiment, there is provided a third syringe of the solution containing the crystallizing agent of different concentration. The transfer device connects the first and third syringes to the processing chamber, and thereby the concentration of the solution of the crystallizing agent supplied to the processing chamber is changed with time. This embodiment corresponds to the gradient method.

In another preferred embodiment, the protein solution is filled in the processing chamber on the ground, and sealed therein by a dialysis membrane. The syringe supplies the solution of the crystallizing agent to the processing chamber to contact with the sealed protein solution via the dialysis membrane. This embodiment corresponds to the dialysis method.

In still another embodiment, the protein solution is filled in the processing chamber on the ground and sealed. After transporting to a space station, the seal is broken and the syringe supplies the solution of the crystallizing agent to the processing chamber upon actuation. Thereby, the protein solution and the solution of the crystallizing agent are held with a separation filled by a gas, and the crystallization is achieved in the protein solution according to the vapor diffusion method.

Another object of the present invention is to provide an apparatus for processing a material under the microgravity environment, comprising: a frame; a plurality of cell units provided in the frame, each of the cell units including one or more syringes for holding materials that participate in the material processing, a processing chamber for achieving the material processing therein, an observation window provided on the processing chamber, and transfer device for supplying the material in the syringes to the processing chamber, the syringes and the processing chamber being provided detachable from the cell unit, the plurality of cell units being disposed such that the observation windows of the processing chambers are arranged generally on a common plane to face in a first direction; a syringe actuating mechanism provided in correspondence to each of the cell units for activating the syringes individually; and observation device for moving along the plane for observing the progress of the material processing in the processing chambers of the cell units via the observation windows.

According to the present invention, the experiment can be achieved automatically as a result of use of the syringe actuating mechanism and the observation means. Thereby, the valuable resource of the astronaut is saved substantially and the cost of the experiment is reduced. In addition, by replacing the syringes and the processing chamber for each experiment, one can eliminate the need of transporting the entire apparatus from the ground into space and from space to the ground. In a typical example, only the processing chamber is transported from the ground to the space for each experiment and returned to the ground after the experiment. The syringe is replaced in orbit each time a new experiment is started by using the stock of syringes in the space station. In this experiment, although one needs to transport the entire apparatus to the space station at the beginning, the cost for the later stage of the experiment is significantly reduced.

Other objects and further features of the present invention will become apparent from the following detailed description when read in conjunction with the attached drawings.

DETAILED DESCRIPTION

Figure 3:
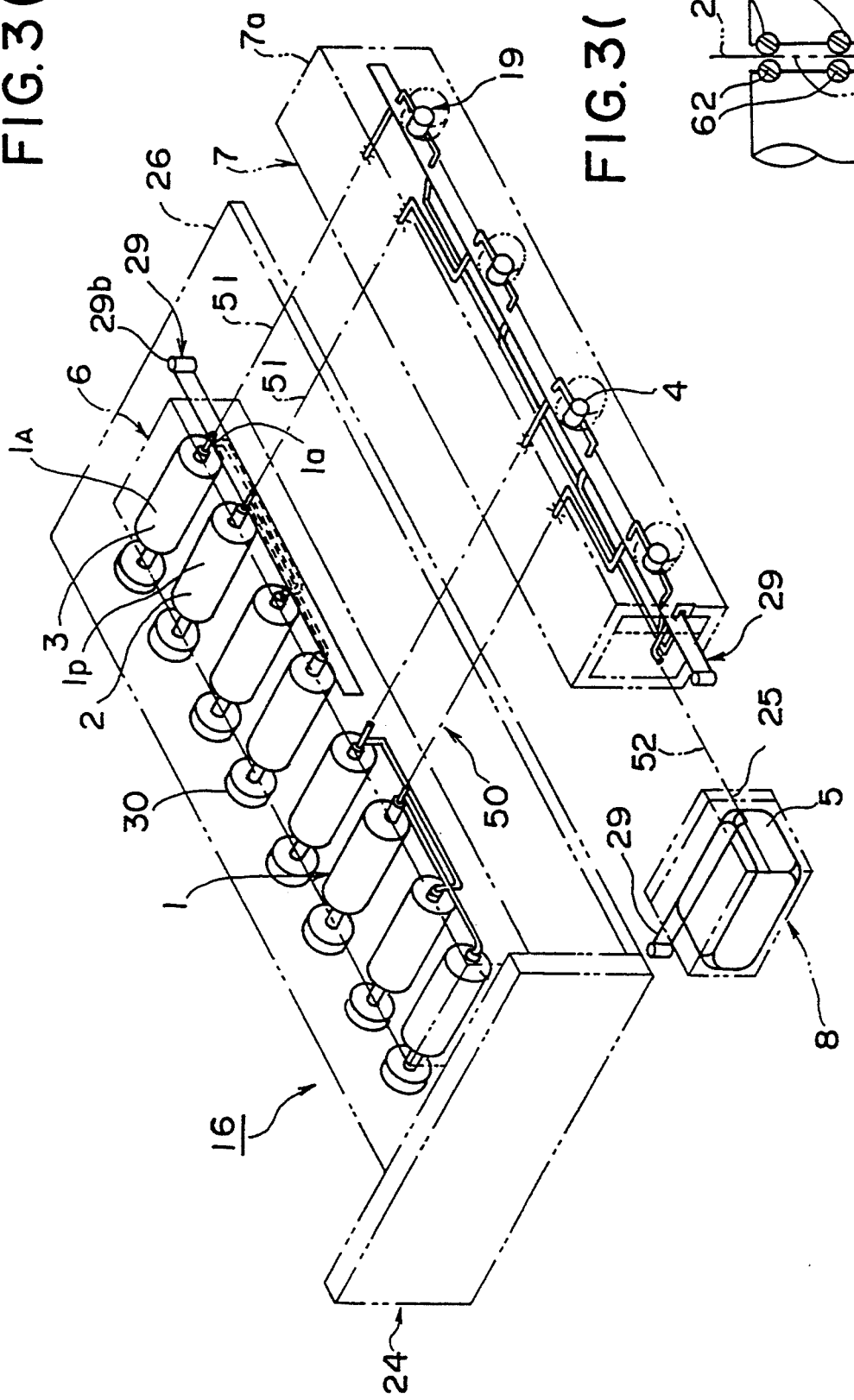
FIGS. 3(a)–3(b) are perspective views showing the apparatus according to a first embodiment of the present invention.

FIG. 3(A) shows the perspective view of the essential part of the apparatus according to a first embodiment of the present invention.

Figure 1:
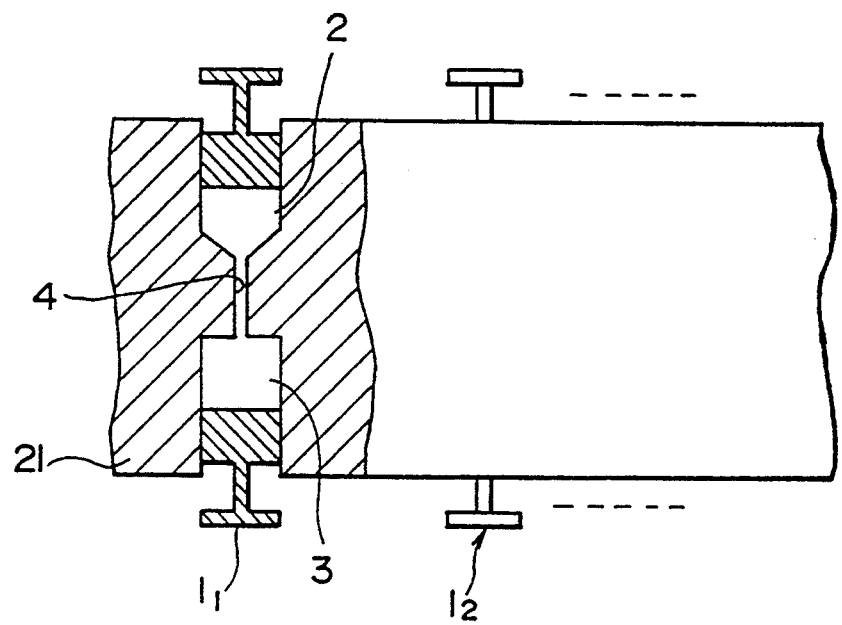
FIG. 1 is a diagram showing a conventional apparatus used for growing a protein crystal in the microgravity environment.
Figure 2:
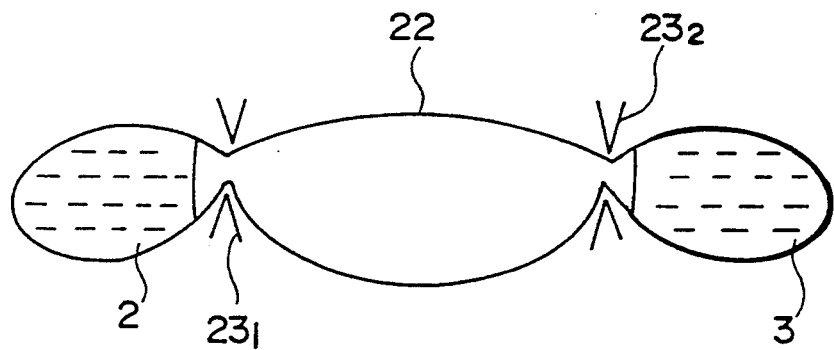
FIG. 2 is a diagram showing another conventional apparatus used for growing a protein crystal in the microgravity environment.

Referring to FIG. 3(A), the essential part of the apparatus forms a cell unit 16 that includes a plurality of syringes 1 similar to the syringes of FIG. 1 and FIG. 2 for holding protein solutions and/or crystallizing agents. In the apparatus of FIG. 3(A), the syringes 1 are held in a block 6 that in turn is mounted on an experiment unit 24. As will be described later, the experiment unit 24 is mounted on a frame 15 that is fixed on the frame of a space vehicle such as a space station and forms a part of the frame 15. The syringes 1, on the other hand, are mounded detachably on the block 6 for repeating the experiment for various materials. Alternatively, the block 6 itself may be provided detachably on the experiment unit 24.

Each syringe 1 has a piston 30 and an outlet 1a closed by a valve mechanism that uses a seal strip 29. The seal strip 29 is held between a pair of opposing seal rings 61, 62 as shown in FIG. 3(B), wherein the seal ring 62 is located at the side of the strip 29 corresponding to the opening of the outlet 1a while the other seal ring 61 is located at the other side of the seal strip 29 in corresponding to the opening of a tube 51 that forms an interconnection system 50 of the apparatus for supplying the protein solution or the crystallizing agent. The seal strip 29 is formed with a number of openings 29a as shown in FIG. 3(B), and the communication between the outlet 1a and the interconnection system 50 is established or interrupted upon moving a pulling tag 29b formed at the end of the seal strip 29.

In the illustrated example, there are two types of syringes, $1_P$ and $1_A$, wherein the syringes $1_P$ contain the protein solution 2 and the syringes $1_A$ contain the solution including crystallizing agent 3.

The interconnection system 50 connects the syringes 1 in the block 6 to a cell block 7 wherein a plurality of processing chambers 4 are formed. As shown in FIG. 3(A), the communication between the cell block 7 and the interconnection system 50 is established or interrupted by a valve mechanism that uses the seal strip 29. In the cell block 7, each processing chamber 4 is connected to one or more tubes 51 as will be described later, and the crystallization of the protein occurs in the processing chamber 4. In order to observe the progress of the crystallization, an observation window 19 is formed in correspondence to each processing chamber 4. It should be noted that the cell block 7 is mounted on the body 24 of the cell unit 16 detachably with a predetermined orientation such that the observation windows 19 are formed on the same side of the cell block 7 as shown in FIG. 3(A).

Further, there is provided a collection block 8 that includes a detachable recovery container 5 in connection with the processing chambers 4 of the cell block 7 via a tube 52 for collecting the solution that is expelled from the processing chamber 4. The communication between the cell block 7 and the recovery container 5 is achieved by the tube 52, and there is provided a valve mechanism that employs the seal strip 29 described previously with reference to FIG. 3(B) for controlling the communication.

Figure 4:
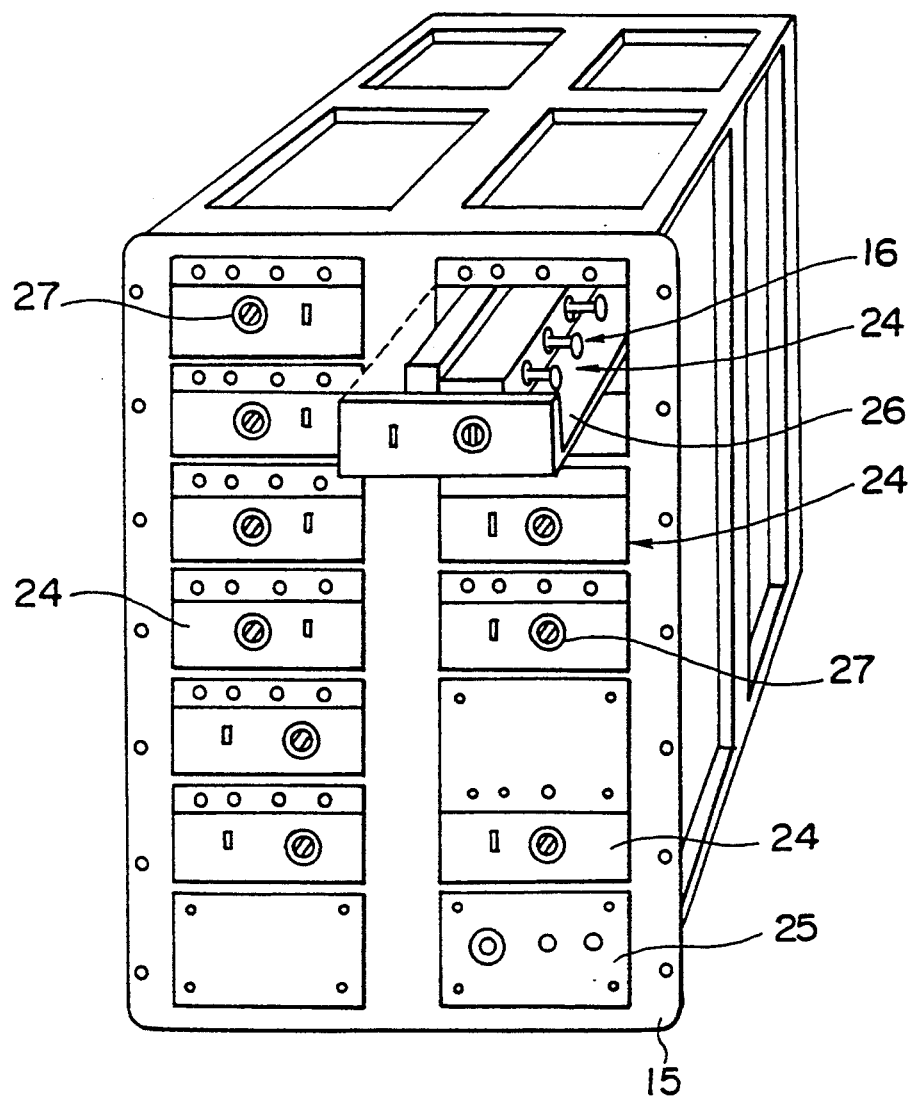
FIG. 4 is a diagram showing the overall view of the apparatus of FIG. 3.

FIG. 4 shows the overall construction of the apparatus of the present invention as assembled in a frame 15 that is mounted on the frame of the space vehicle such as a space station.

Referring to FIG. 4, the cell blocks 16 are mounted on the experiment unit 24 that in turn is mounted on the frame 15 like a drawer. It should be noted that a number of such experiment units 24 are mounted on the frame 15. As shown in FIG. 4, the experiment unit 24 is attached slidable on the frame 15 and is pulled out therefrom by releasing a lock 27. Further, at the bottom part of the frame 15, a power unit 25 is provided. The frame 15 includes a panel that surrounds the space inside the frame 15, and there is provided a temperature regulation mechanism inside the space as will be described later.

Figure 5:
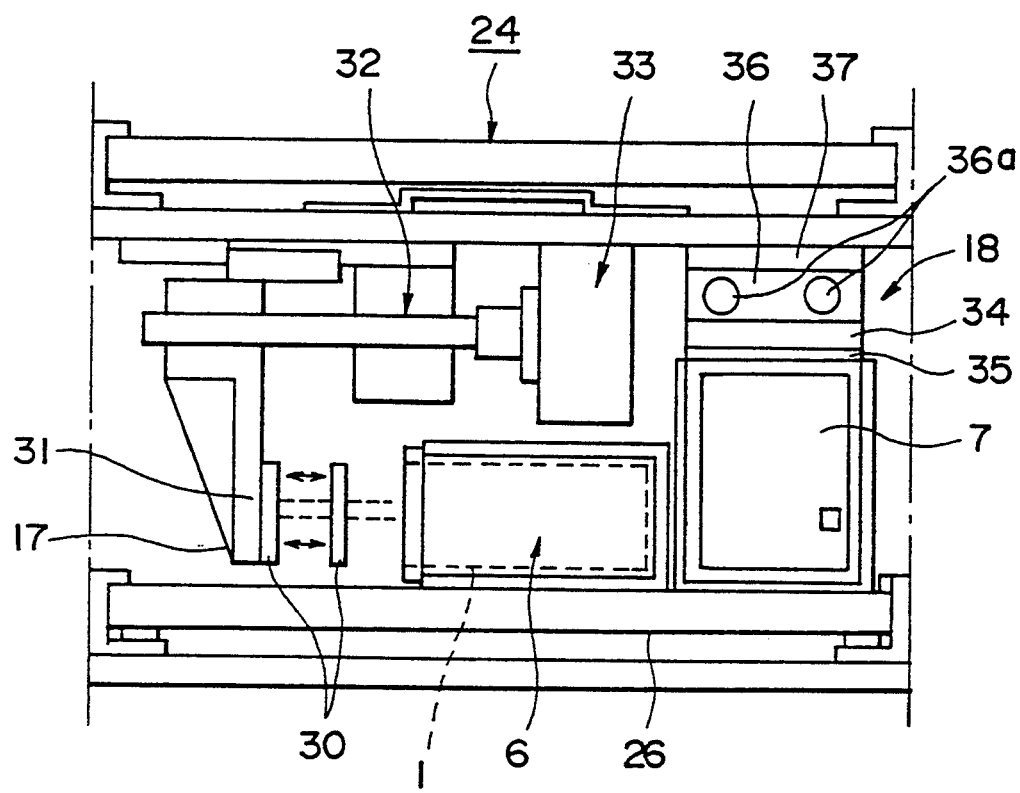
FIG. 5 is a diagram showing a syringe actuation mechanism used in the apparatus of FIG. 3.

FIG. 5 shows a syringe actuating mechanism 17 mounted on the experiment unit 24 in combination with the cell unit 16 for actuating the piston 30 of the syringes 1.

Referring to FIG. 5, the syringe actuating mechanism 17 includes a push plate 31 that engages with the piston 30, and the push plate 31 is moved in the direction as shown by the arrows in FIG. 5 by a screw 32 that engages with the push plate 31. In order to drive the screw 32, a stepping motor 33 is provided that drives the screw 32 in response to a control signal supplied thereto from an external controller (not shown). By controlling the stepping motor 33, various experiments are possible as will be described later. In order to actuate the syringes individually, the actuating mechanism 17 may be provided for each of the syringes 1. However, it is preferable to design the syringe actuating mechanism 17 such that a plurality of selected syringes are activated simultaneously.

In order to control the temperature of experiment, each experiment unit 24 carries therein a temperature regulating mechanism 18 that includes a Peltier element 34. The Peltier element 34 contacts with a heat conductor member 35 provided on the top surface of the cell block 7 and controls the temperature inside the processing chamber 4. In the illustrated example, therefore, the Peltier element 34 contacts with the cell block 7 from the top via the heat conductor member 35. Above the Peltier element, there is provided a cooling part 36 including a passage 36a of cooling water, and a thermal insulator 37 is provided to cover the cell block 7. The engagement between the Peltier element 34 and the heat conductor member 35 is achieved when the experiment unit 24 is mounted on the frame 15. This may for example be achieved by raising a body of the unit 24 upon actuation of the lock 27. As this mechanism is not essential for the disclosure of the present invention, and as the designing of such a mechanism is obvious for the person skilled in the art, further description will be omitted.

In order to achieve the automatic observation of the progress of crystallization taking place in the processing chamber 4, the present invention uses an automatic observation system described below.

It should be noted in FIG. 3(a) that the observation windows 19 of the processing chamber 4 are formed on the same side of the body of the cell unit 7.

Figure 6:
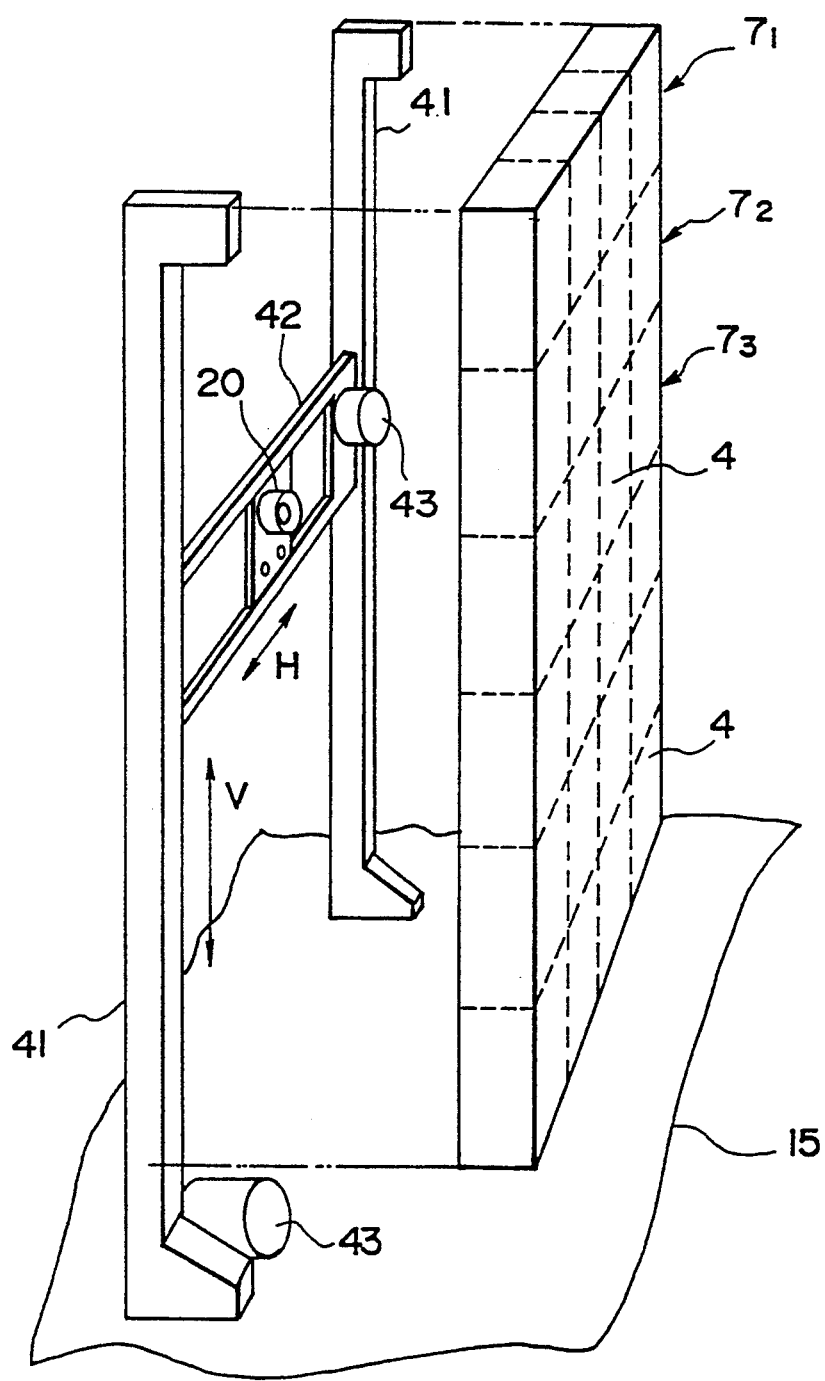
FIG. 6 is a diagram showing an automatic observation mechanism used in the apparatus of FIGS. 3(a)–3(b) for observing the progress of the growth of protein crystals.

FIG. 6 shows the automatic observation system. This system includes a fixed frame or guide rail 41 mounted on the frame 15 and a movable frame 42 that moves in the vertical direction V by a motor 43 along the guide rail 41. The movable frame 42 in turn forms a guide rail extending in the horizontal direction H and carries an observation unit 20 in the manner movable in the horizontal direction in response to the actuation of a motor 43. Thereby, the observation unit 20 is moved in the frame 15 along a vertical plane that faces the observation windows 19 of the processing chambers 4. In FIG. 6, it should be noted that there are stacked a number of cell blocks $7_1$, $7_2$, . . . in the frame 15 in correspondence to each experiment unit 24. Thus, by providing the automatic observation system of FIG. 6 in correspondence to the center of the frame 15 of FIG. 4, and by providing the observation unit 20 at the rear side of the movable frame 42, the observation for the entire processing chambers 4 in the frame 15 becomes possible.

Figure 7:
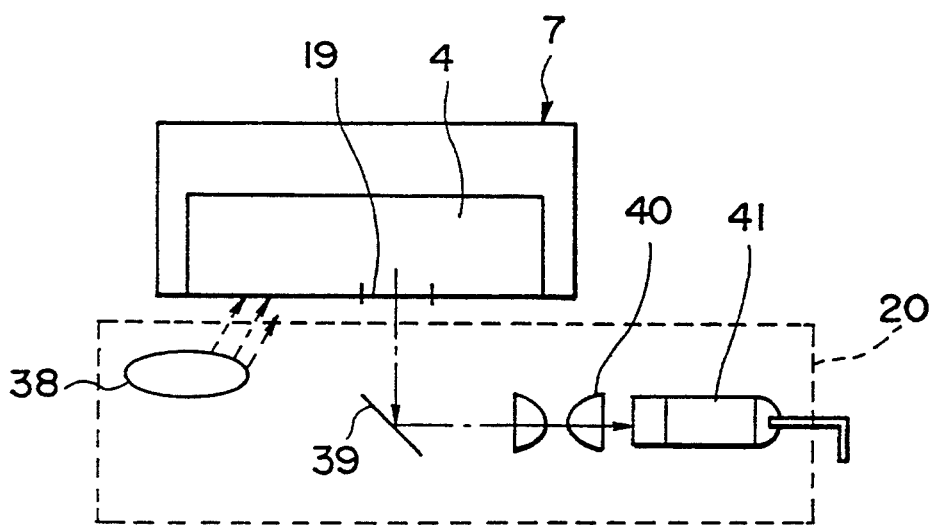
FIG. 7 is a diagram showing the principle of the observation achieved by the mechanism of FIG. 6.

FIG. 7 shows the construction of the observation unit 20 of FIG. 6.

Referring to FIG. 7, the observation unit 20 includes a light source 38 of LED and the like for illuminating the processing chamber 4 and a CCD camera 41 for observing the chamber 4 via the window 19. In order to direct the light from the chamber 4 to the camera 41, various optical elements such as a mirror 39 and a lens system 40 may be used. The output of the CCD camera 41 may be stored in a memory of a controller (not illustrated).

In the present invention, it should be noted that there is a flexibility in the connection of the syringes 1 in the block 6 to the processing chambers 4 in the cell block 7. By changing the interconnection system 50, one can achieve various experiments by the same experimental apparatus. Hereinafter, various experiments achieved by the apparatus of FIG. 3 will be described.

Figure 8:
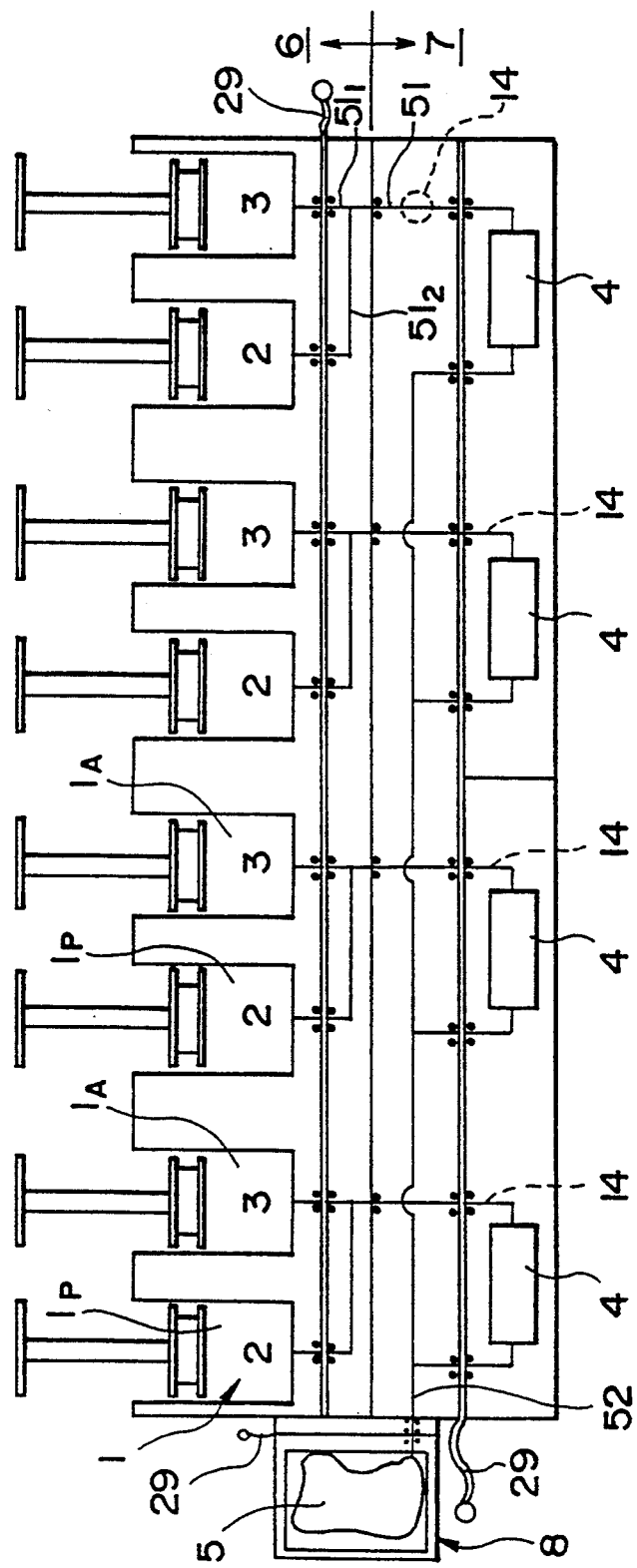
FIG. 8 is a diagram showing a second embodiment of the present invention, wherein the apparatus of FIGS. 3(a)–3(b) is connected to achieve the crystallization according to the batch method.

FIG. 8 shows a second embodiment of the present invention used for crystallizing the protein crystals by the batch method. This diagram generally corresponds to the plan view of FIG. 3(A). It will be noted that the block 6 for the syringes 1 and the block 7 for the processing chambers 4 are provided adjacent with each other, and the syringes 1 are formed in the block 6.

In this embodiment, the syringes 1 are arranged to form pairs in the block 6, and each pair includes a syringe $1_P$ containing the protein solution 2 and a syringe $1_A$ containing the crystallizing agent 3. In the present embodiment, the actuating mechanism 17 is designed to actuate a pair of adjacent syringes $1_P$ and $1_A$ for the protein solution 2 and the crystallizing agent 3 simultaneously. As illustrated, the syringe $1_P$ for the protein solution 2 has an outlet passage $51_1$ extending in the block 6 while the syringe $1_A$ for the crystallizing agent has an outlet passage $51_2$ also extending in the block. These passages $51_1$ and $51_2$ are connected to merge with each other to form a single passage 51 that is connected to the processing chamber 4 of the cell block 7. It should be noted that the passages 51, $51_1$, $51_2$ of FIG. 8 are typically realized by a flexible tube.

When starting an experiment, the syringe block 6, carrying thereon the syringes $1_A$ and $1_P$ that are filled with the crystallizing agent and the protein solution, is taken out from the regulated temperature environment and mounted on the experiment unit 24. In response to the mounting, the tubes $51_1$ and $52_2$ are connected to the respective outlets of the syringes $1_A$ and $1_P$, and the seal strip 29 is actuated to establish the communication between the syringes 1 and the processing chamber 4. Further, the processing chambers 4 are connected to the recovery container 5 of the block 8 by the tube 52. Thereby, the cell unit 16 formed from the block 6, block 7 and the block 8 is ready for starting the experiment.

Upon actuation of both syringes $1_P$ and $1_A$, the protein solution 2 and the crystallizing agent 3 are admixed in the tube 51 and transferred to the processing chamber 4. In response to the transfer of the mixture into the chamber 4, the air that has filled the chamber 4 is expelled and transferred to the recovery container 5 via the tube 52. After the mixture is thus transferred to the chamber 4, the mixture is held stationary to cause the crystallization therein. Generally, complete mixing of the protein solution 2 and the crystallizing agent 3 is not necessary for this experiment, and a satisfactory mixing is achieved by simply merging the passages $51_1$ and $51_2$. Of course, one may provide a stirrer or other means for ensuring the complete mixing on the tube 51. On the intermediate part of the tube 51, one may provide further a bubble trap 14 to remove the bubbles of air. Such a bubble trap 14 is easily achieved by a sponge of hydrophobic fibers. During the crystallization, the progress of the process is periodically monitored by the observation unit 20 as already described.

After the experiment is completed, the seal strip 29 for the cell block 7 is actuated to seal the chamber 4, and the cell block 7 is dismounted from the body of the experiment unfit 24. The cell block 7 contains the protein crystals in the processing chamber 4 and is returned to the ground. Further, the syringe block 6 may be dismounted and returned to the ground similarly.

Figure 9:
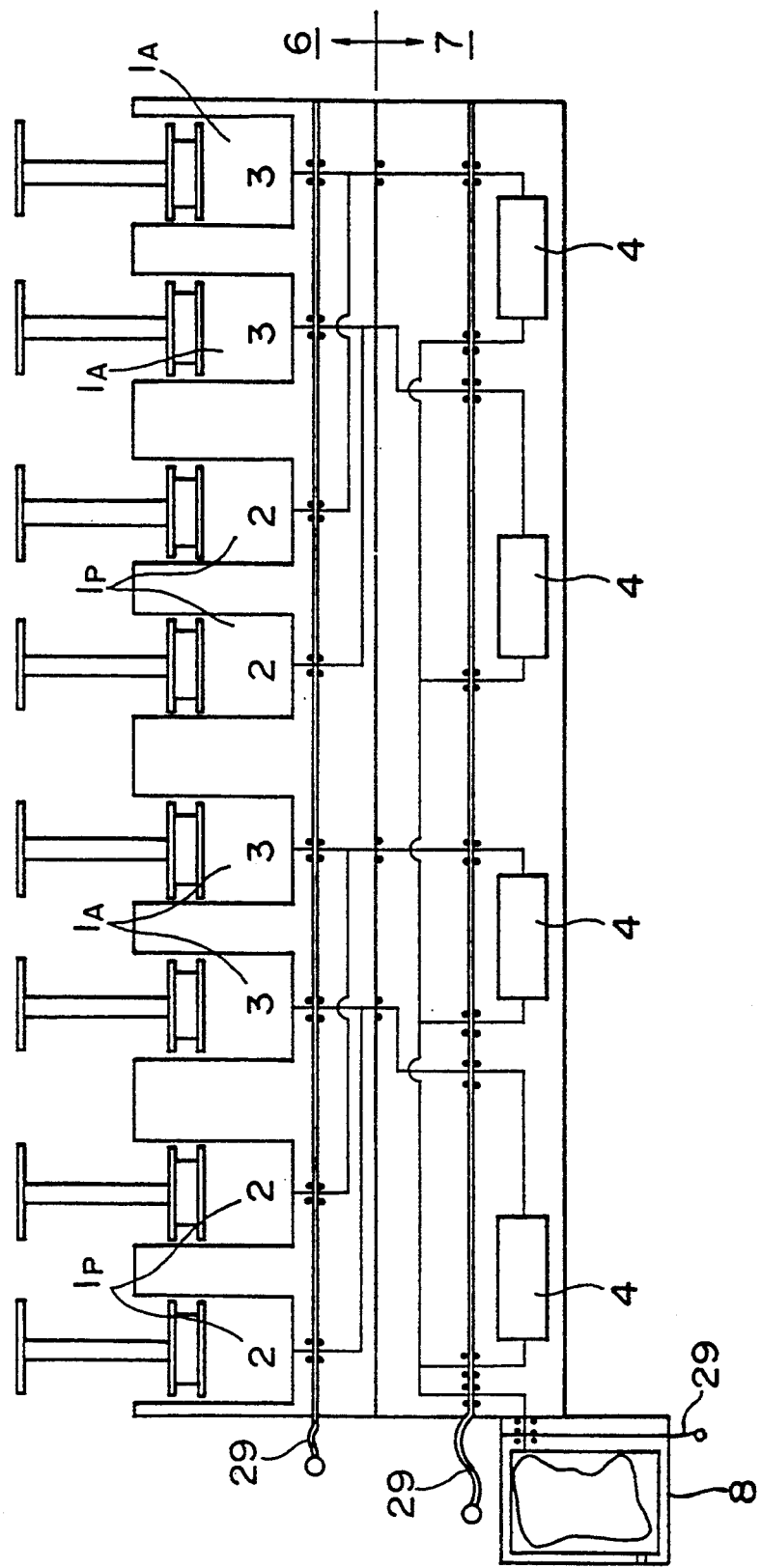
FIG. 9 is a diagram showing a third embodiment of the present invention, wherein the apparatus of FIGS. 3(a)–3(b) is connected to achieve the crystallization according to the free interface diffusion method.

Next, a third embodiment of the present invention for the free interface diffusion method will be described with reference to FIG. 9.

In this embodiment, the construction of the apparatus is substantially identical with the apparatus of FIG. 8, except for the actuating mechanism 17 that now actuates the syringes consecutively such that the protein solution 2 is first supplied to the chamber 4 and the crystallizing agent 3 is supplied next or vice versa. In order to achieve this actuation sequence, two of the syringes $1_A$ for the crystallizing agent 3 are arranged adjacent each other for the simultaneous actuation. Similarly, two of the syringes $1_P$ for the protein solution 2 are arranged adjacent each other for the simultaneous actuation.

In response to the consecutive actuation of the syringe $1_P$ and the syringe $1_A$, an interface is formed in the processing chamber 4 between the protein solution 2 that is sent thereto previously and the crystallizing agent 3 that is sent subsequently, and one can achieve the crystallization at the interface. Thus, this embodiment achieves the free interface diffusion method.

Figure 10:
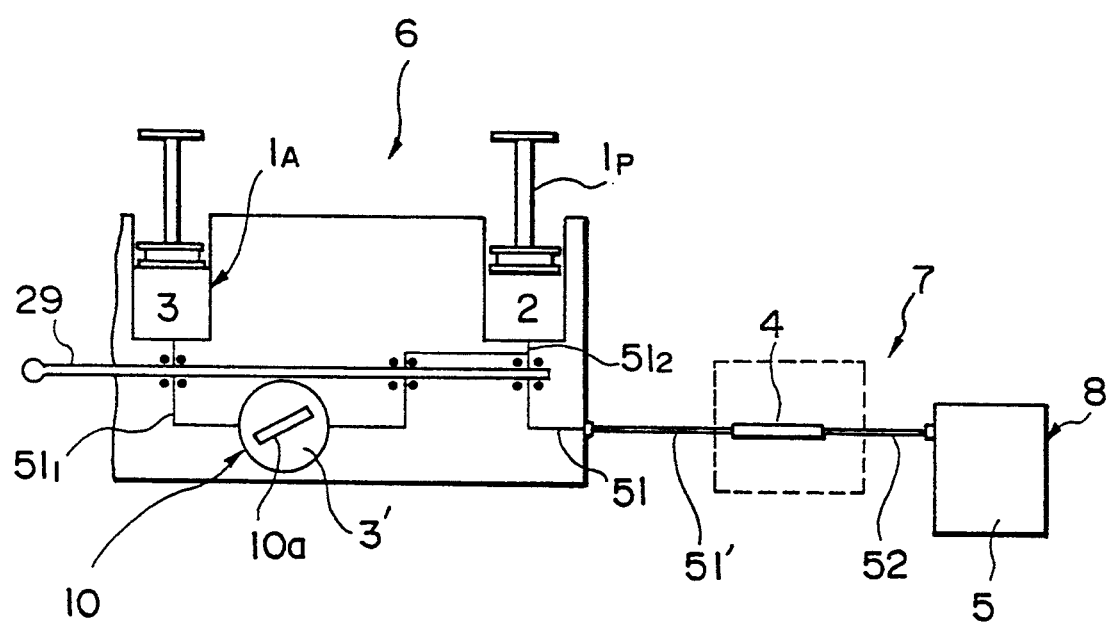
FIG. 10 is a diagram :showing a fourth embodiment of the present invention, wherein the apparatus of FIGS. 3(a)–3(b) is connected to achieve the crystallization according to the gradient method.

FIG. 10 shows a fourth embodiment of the present invention for achieving the crystallization according to the gradient method. In order to implement the gradient method, the present embodiment includes a modification of the structure of the apparatus of FIG. 8. In FIG. 10, only the essential part is illustrated for the sake of simplicity of the drawing and explanation. It should be noted that FIG. 10 shows the schematic plan view of the apparatus. See FIG. 3 for comparison.

In the present embodiment, the syringes $1_P$ and $1_A$ are formed in the block 6 for holding the protein solution 2 and the crystallizing agent 3 separately. Further, the tubes $51_1$ and $51_2$ are connected to the block 6. Similar to the embodiment of FIG. 8, the tubes $51_1$ and $51_2$ merge with each other to form the single passage 51 that is connected to the processing chamber 4 in the cell block 7 by a flexible tube 51'. The processing chamber 4 is further connected to the recovery container 5 via the passage 52 that is also realized by a flexible tube.

In the intermediate location of the passage $51_1$, there is provided a container 10 for holding a crystallizing agent 3' having a concentration different from the crystallizing agent 3 in the syringe 1. In the container 10, there is provided a stirrer 10a for causing stirring.

Thus, upon actuation of the syringe 1, the content of the container 3' is supplied first to the processing chamber 4 together with the protein solution 2. With continuous actuation, the agent 3 in the syringe starts to be fed to the container 10 where the agent 3 is mixed with the agent 3' held therein. Thus, the concentration of the crystallizing agent mixture that is fed to the processing chamber 4 via the passage 51 and the tube 51' changes with time.

Such a variation of the concentration of the crystallizing agent mixture with time in turn induces a gradient in the concentration of the crystallizing agent in the processing chamber 4 as the crystallizing agent mixture is fed to the chamber 4 together with the protein solution 2 gradually. In the present invention, the processing chamber 4 is thereby provided with a device for fixing the concentration gradient of the crystallizing agent in the chamber 4 for realizing various crystallizing conditions.

Figure 11:
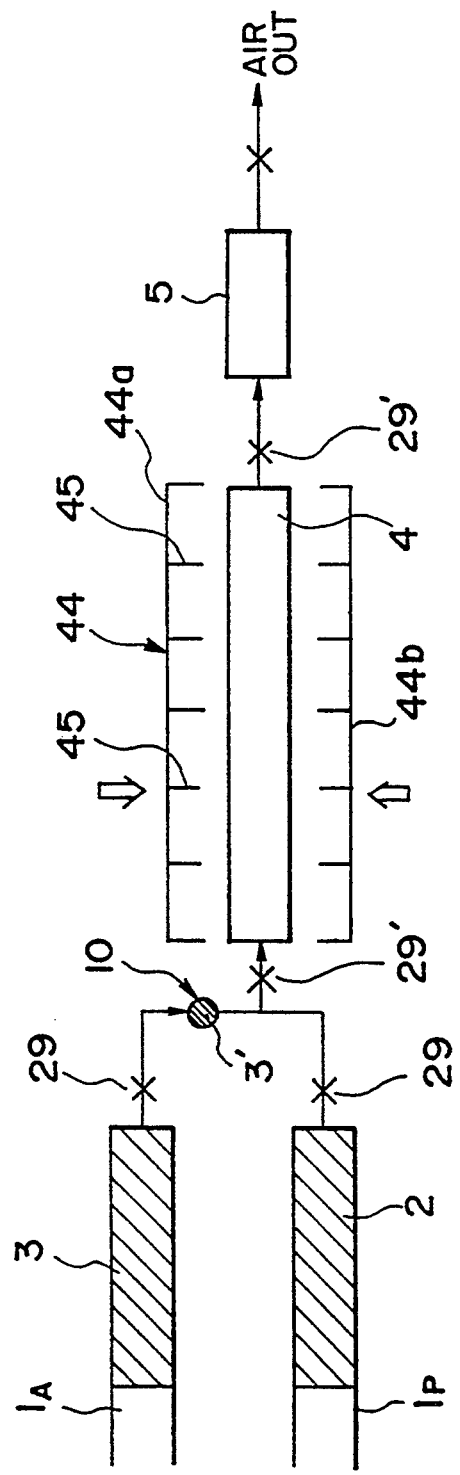
FIG. 11 is a diagram showing the principle of the gradient method achieved in the apparatus of FIG. 10.

FIG. 11 shows the processing chamber 4 that is provided with a device 44 for fixing the concentration gradient.

Referring to FIG. 11, the processing chamber 4 of the present embodiment is formed from a transparent, flexible tube, and the device 44 is formed from a pair of opposing comb-shaped elements 44a and 44b each having a number of teeth 45. Upon actuation of the device 44, the opposing elements 44a and 44b are pressed with each other such that each opposing tooth 45 engages with each other. Thereby, the flexible tube forming the processing chamber 4 is divided into a number of cells each characterized by a particular concentration level of the crystallizing agent mixture. By leaving the chamber 4 for a predetermined duration while maintaining this state, one can achieve the crystallization of the protein crystals simultaneously in the respective cells at various conditions.

FIG. 11 further shows the valves realized by the seal strip 29. Before the start of the experiment, the seal strip 29 interrupts the communication between respective parts of the block 6 to seal the syringes 1 in the block. Upon commencement of the experiment, the seal strip 29 is actuated to establish the communication, and the foregoing feeding of the protein solution 2 and the crystallizing agents 3 and 3' to the processing chamber 4 is achieved in response to the actuation of the syringes. After the crystallization is completed, both ends of the flexible tube forming the processing chamber 4 is closed by a pinch cock 29' or the like, and the processing chamber 4 is removed for transportation to the ground. During this transportation, the device 44 is held in the activated state such that the communication between the cells in the chamber 4 is interrupted.

Figure 12:
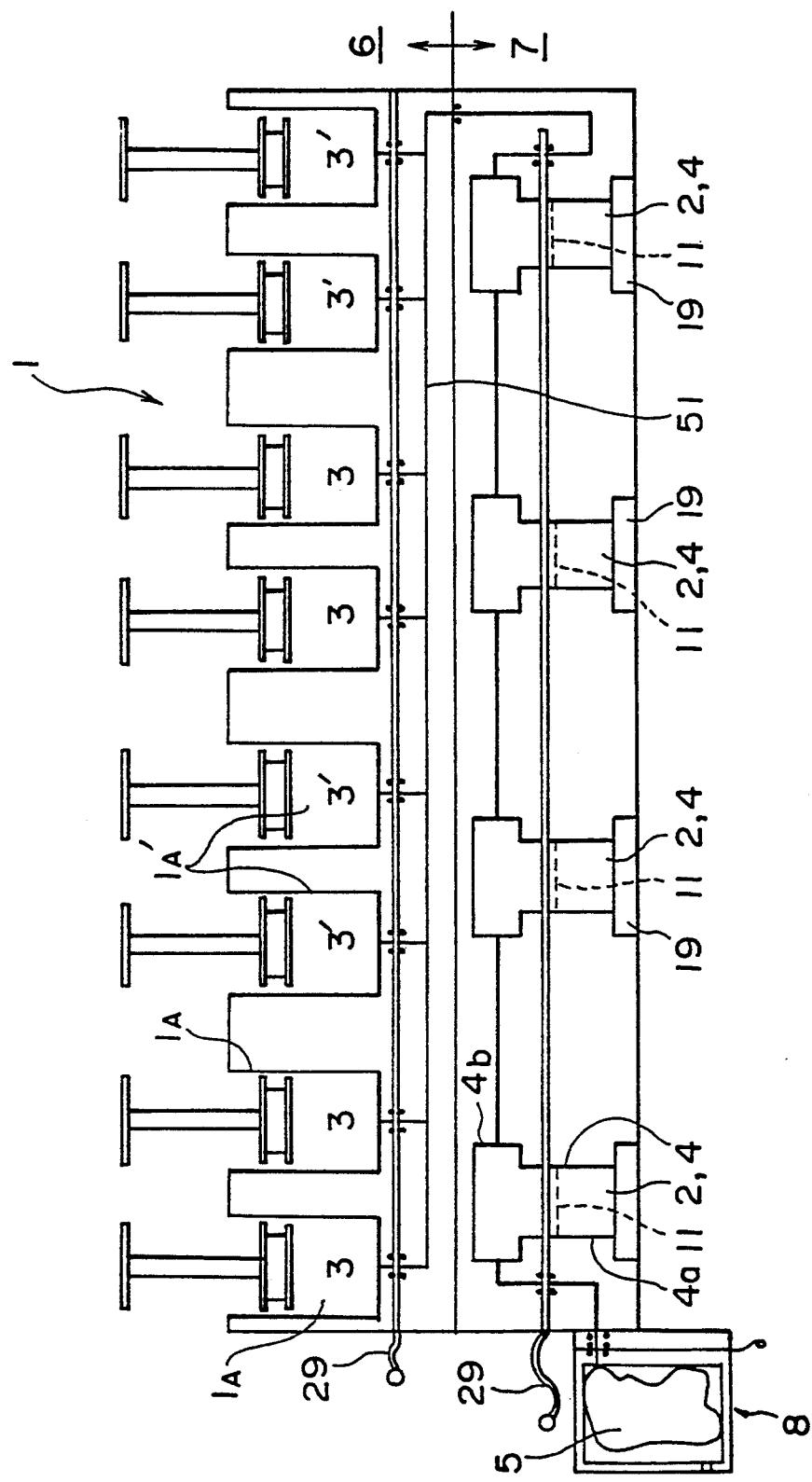
FIG. 12 is a diagram showing a fifth embodiment of the present invention, wherein the apparatus of FIGS. 3(a)–3(b) is connected to achieve the crystallization according to the dialysis method.

FIG. 12 shows a fifth embodiment of the present invention.

In the present embodiment, the apparatus has a structure similar to FIG. 8 except that the protein solution 2 is held in the processing chamber 4 and sealed therein by a dialysis membrane 11. As shown in FIG. 12, the protein solution is held in an inner chamber 4a defined in the chamber 4 by the membrane 11. Thereby, the entire syringes 1 are used to hold the crystallizing agent. In the present embodiment, two crystallizing agents 3 and 3' having different concentration levels are used for the experiment. Thereby, there are formed two types of syringes, a syringe $1_A$ for the agent 3 and a syringe $1_A'$ for the agent 3', both in the block 6, wherein all the syringes are connected commonly to the passage 51 that extends to an outer chamber 4b defined in the processing chamber 4. The outer chamber 4b is separated from the inner chamber 4a by the dialysis membrane 11.

In the experiment, the block 6 is taken out from the regulated environment and mounted on the experiment unit 24 in connection with the cell block 7 that carries the processing chamber 4. After establishing the communication of the passage 51 with the syringes 1 as well as the processing chamber 5 by actuating the seal strip 29, the syringes $1_A$ for the crystallizing agent 3 is activated. In response thereto, the agent 3 of the lower concentration level is fed to the outer chamber 4b of the processing chamber 4 for cleaning the passage wall of the passage 51. Next, the syringe $1_A'$ is actuated to feed the crystallizing agent 3' of higher concentration level to the outer chamber 4b. The agent 3' that have filled the outer chamber 4 is expelled to the recovery container 5. Thereby, the crystallizing agent 3' contacts with the protein solution 2 via the dialysis membrane 11 and causes the oversaturation in the protein solution 2 held in the inner chamber 4a. After the crystallization achieved, the processing chamber 4 is sealed by the seal strip 29 and the cell block 7 removed for transportation back to the ground.

Figure 13:
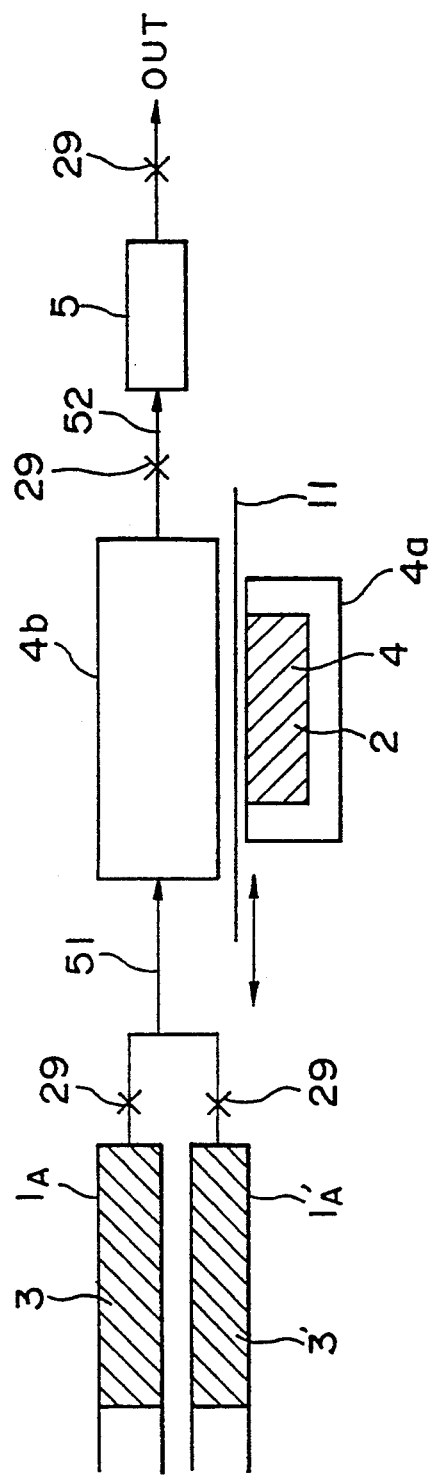
FIG. 13 is a diagram showing the principle of the dialysis method achieved in the apparatus of FIG. 12.

FIG. 13 shows an enlarged, yet schematic view showing the principle of the apparatus of FIG. 12. For the sake of simplicity, only a pair of syringes $1_A$ and $1_A'$ are shown. As shown in FIG. 13, the syringes $1_A$ and $1_A'$ are connected to the outer chamber 4b of the processing chamber 4 by the passage 51, and the outer chamber 4b is further connected to the recovery container 5 via the passage 52. The recovery container 5 further has a vent for releasing the air in the chamber 4b. The crystallizing agents 3 and 3' are fed to the outer chamber 4b as already described and the crystallization occurs in the protein solution 2 in the inner chamber 4a as a result of the transport of materials through the dialysis membrane 11. For example, the water in the solution 2 may be transported to the crystallizing agent 3 via the membrane 11 and the oversaturation condition appears in the solution 2.

Figure 14:
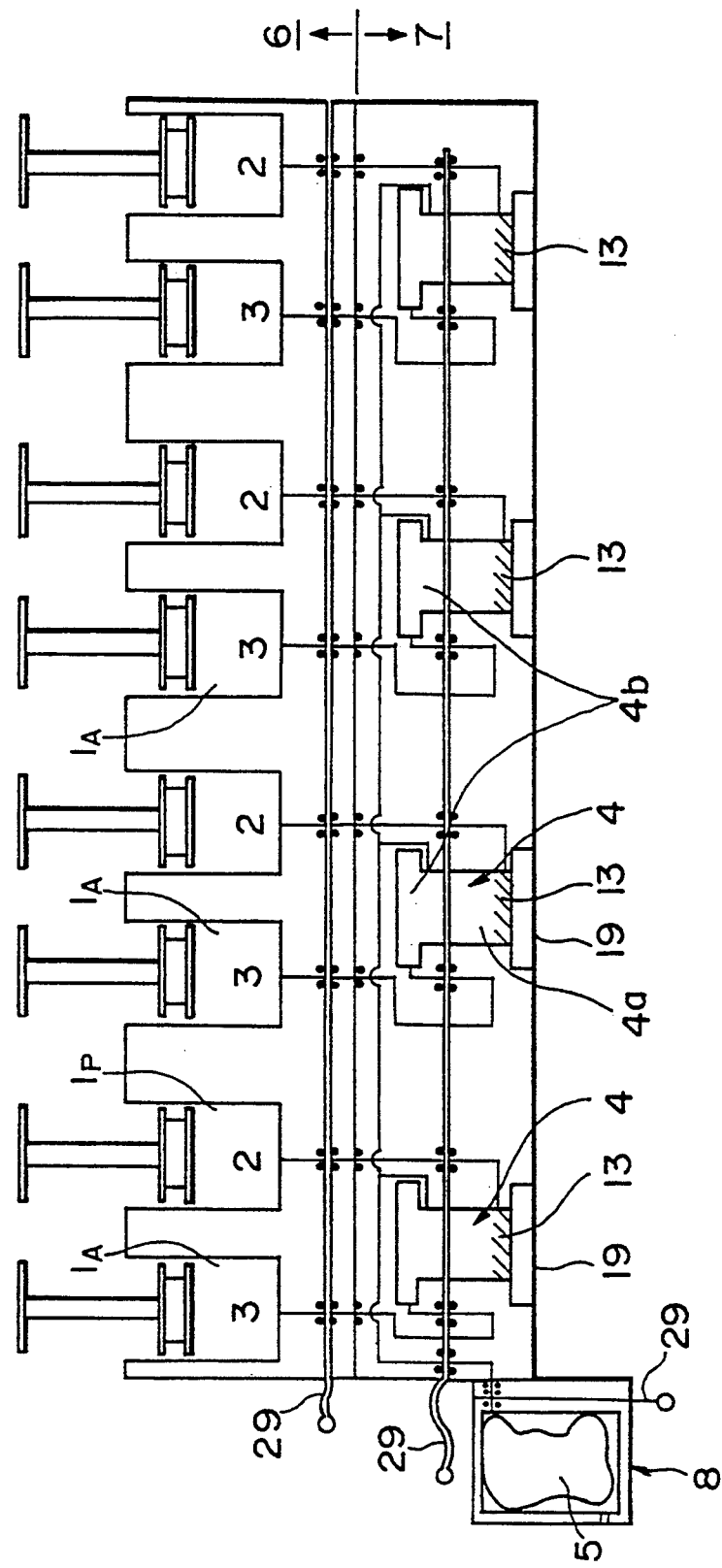
FIG. 14 is a diagram showing a sixth embodiment of the present invention, wherein the apparatus of FIG. 3 is connected to achieve the crystallization according to the vapor diffusion method.

FIG. 14 shows a sixth embodiment of the present invention for implementing the crystallization of protein according to the vapor diffusion method.

In this embodiment, the processing chamber 4 is formed from the inner chamber 4a and the outer chamber 4b similar to the previous embodiment, wherein the inner chamber 4a is supplied with the protein solution 2 from the syringe 1p and the outer chamber 4b is supplied with the crystallizing agent 3 from the syringe $1_A$. The difference of the present embodiment over the previous one in the designing of the processing chamber 4 exists in the point that the inner chamber 4a and the outer chamber 4b are communication with each other rather than separated by the membrane 11 as in the previous embodiment. Thus, the distinction between the inner chamber 4a and the outer chamber 4b is somewhat arbitrary except that they are formed at opposing ends of the processing chamber 4. Other part of the apparatus is substantially identical with the apparatus of FIG. 8.

Figure 15:
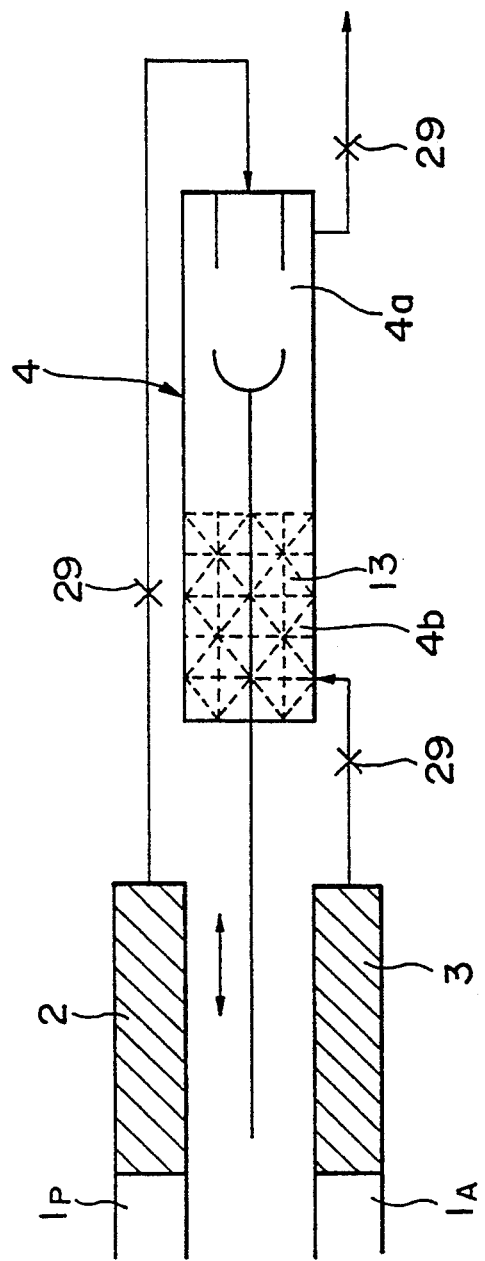
FIG. 15 is a diagram showing the principle of the vapor diffusion method achieved in the apparatus of FIG. 14.

FIG. 15 shows a schematical illustration of the essential part of the apparatus of FIG. 14 in the enlarged scale. For the sake of clarity of the illustration, only a pair of the syringes 1p and $1_A$ are shown.

As shown in FIG. 15, the protein solution 2 in the syringe 1p is fed to the inner chamber 4a of the processing chamber, while the crystallizing agent 3 in the syringe $1_A$ is supplied to a liquid-retaining element 13 such as a sponge that is held in the outer chamber 4b of the processing chamber 4. Thereby, the direct contact of the protein solution 2 and the crystallizing agent 3 is prevented. The crystallization occurs in the protein solution as a result of the transport of materials between the solution 2 and the agent 3 in the form of vapor.

Figure 16:
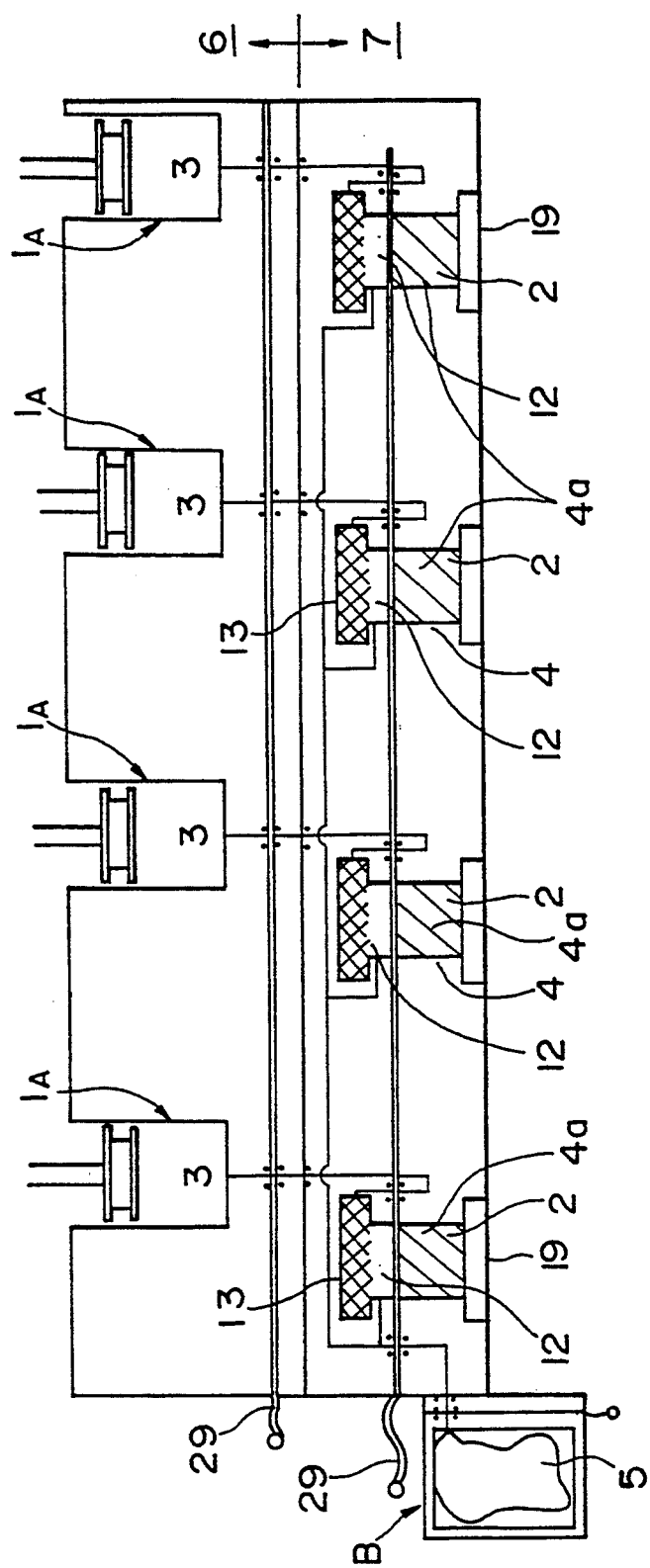
FIG. 16 is a diagram showing a modification of the apparatus of FIG. 15.

FIG. 16 shows a modification of the apparatus of FIG. 14, wherein the protein solution 2 is sealed in the inner chamber 4a of the processing chamber 4 by the seal realized by the seal strip 29 as described previously. After mounting the cell block 7 on the experiment unit 24, the seal is broken by actuating the seal strip 29. Further, the syringes $1_A$ for holding the crystallizing agent 3 are activated and the crystallizing agent 3 is transferred to the liquid retaining element 13. There, the crystallization of the protein crystal is achieved in the solution 2 according to the vapor diffusion method similar to the embodiment of FIG. 14.

As described heretofore, the present invention enables various experiments by designing the interconnection part 50 variously. The passage 51 that forms the interconnection part 50 may either be a tube as described previously or a passage that is provided within the blocks 6 and 7 of a solid material.

Further, the present invention is not limited to the embodiments described heretofore, but various variations and modifications may be made without departing from the scope of the invention.

What is claimed is:

1. An apparatus for processing a material, comprising:
   a base member;
   a syringe block mounted detachably on said base member, said syringe block carrying thereon a plurality of syringes, said plurality of syringes comprising at least a first syringe for holding therein a first fluid and a second syringe for holding therein a second fluid;
   a cell block mounted detachably on said base member, said cell block carrying thereon a plurality of processing chambers supplied with said first and second fluids for processing a material as a result of a mixing of said first and second fluids;
   interconnection means for connecting said first syringe and said second syringe to said processing chamber that corresponds to said first and second syringes, said interconnection means establishing a communication between said first syringe and said processing chamber for allowing said first fluid to flow from said first syringe to said processing chamber, said interconnection means further establishing a communication between said second syringe and said processing chamber for allowing said second fluid to flow from said second syringe to said processing chamber; and
   actuation means provided on said base member for actuating said plurality of syringes wherein said syringe block and cell block are detachable in an environment where said processing is conducted.

2. An apparatus for processing a material as claimed in claim 1 in which said interconnection means comprises a container for holding therein said first fluid such that said container is interposed between said first syringe and said processing chamber in communication therewith such that said first fluid is supplied to said container from said first syringe and such that said first fluid is further supplied from said container to said processing chamber, said container including stirring means for stirring said first fluid.

3. An apparatus for processing a material as claimed in claim 2 in which said container is provided between said first and second syringes such that said container is supplied with said first and second fluids from said first and second syringes.

4. An apparatus for processing a material as claimed in claim 3 in which said processing chamber comprises a flexible tube for causing a crystallization therein, said flexible tube having an inlet for receiving said first and second fluids and an outlet for exhausting a waste fluid, said processing chamber further comprising movable teeth that engage with said flexible tube upon actuation for dividing said flexible tube into a number of cells.

5. An apparatus for processing a material as claimed in claim 1 in which said processing chamber comprises a first chamber and a second chamber separated from each other by sharing a semi-permeable membrane, said second chamber holding therein a third fluid, said first chamber being supplied with said first and second fluids for causing a growth of a crystal in said processing chamber.

6. An apparatus for processing a material as claimed in claim 5 in which said growth of crystal occurs in said second chamber.

7. An apparatus for processing a material as claimed in claim 1 in which said actuation means actuates said first and second syringes sequentially, such that said first and second fluids are supplied to said processing chamber sequentially.

8. An apparatus for processing a material as claimed in claim 7 in which said syringe block carries thereon said first syringe in plurality of numbers, said syringe block further carries thereon said second syringe in plurality of numbers, said first and second syringes being carried on said syringe block such that a plurality of first syringes are disposed adjacent to each other for simultaneous actuation, and such that a plurality of second syringes are disposed adjacent to each other for simultaneous actuation.

9. An apparatus for processing a material, comprising:
a base member;
a syringe block mounted detachably on said base member, said syringe block carrying thereon a syringe that holds therein a first fluid;
a cell block mounted detachably on said base member, said cell block carrying thereon a processing chamber that comprises a first chamber and a second chamber separated from each other by sharing a semi-permeable membrane, said second chamber holding therein a second fluid, said first chamber being supplied with said first fluid for causing a growth of a crystal in said processing chamber;
interconnection means for connecting said syringe to said first chamber of said processing chamber for establishing a communication between said first syringe and said processing chamber such that said first fluid is allowed to flow from said syringe to said first chamber of said processing chamber; and
actuation means provided on said base member for actuating said syringe wherein said syringe block and said cell block are detachable in an environment where said processing is conducted.

10. An apparatus for processing a material as claimed in claim 1 in which said processing chamber comprises a first chamber part and a second chamber part separated from each other spatially, said first chamber part being connected to said first syringe for receiving said first fluid therefrom, said second chamber part being connected to said second syringe for receiving said second fluid therefrom, said processing chamber holding said first fluid and second fluid with a spatial separation from each other, for causing a crystallization from said first fluid.

11. An apparatus for processing a material as claimed in claim 9 in which said growth of crystal occurs in said second chamber.

12. An apparatus for processing a material as claimed in claim 9 in which said cell block carries thereon observation window means for allowing an observation of an interior of said processing chamber.

13. An apparatus for processing a material, comprising:
a frame;
a plurality of cell units mounted on said frame, each of said cell units including:
a base member,
a syringe block mounted detachably on said base member, said syringe block carrying thereon a plurality of syringes, said plurality of syringes comprising at least a first syringe for holding therein a first fluid and a second syringe for holding therein a second fluid,
a cell block mounted detachably on said base member, said cell block carrying thereon a plurality of processing chambers supplied with said first and second fluids for processing a material as a result of a mixing of said first and second fluids,
interconnection means for connecting said first syringe and second syringe to said processing chamber that corresponds to said first and second syringes, said interconnection means establishing a communication between said first syringe and said processing chamber for allowing said first fluid to flow from said first syringe to said processing chamber, said interconnection means further establishing a communication between said second syringe and said processing chamber for allowing said second fluid to flow from said second syringe to said processing chamber, and
an actuation means provided on said base member for actuating said plurality of syringes; and
temperature regulation means for regulating a temperature of said cell units wherein said syringe block and cell block are detachable in an environment where said processing is conducted.

14. An apparatus for processing material as claimed in claim 13 in which, in each of said plurality of cell units, each of said cell blocks carries observation window means facing in a common direction that is common in said plurality of cell units for allowing observation of an interior of said processing chambers, and wherein said apparatus further comprises observation mechanism for observing the interior of said processing chambers via said observation window means, said observation mechanism scanning said plurality of cell units.

15. An apparatus for processing a material, comprising:
a base member;
a syringe block mounted detachably on said base member, said syringe block carrying thereon a syringe that holds therein a first fluid;
a cell block mounted detachably on said base member, said cell block carrying thereon a processing chamber that comprises a first chamber, a second chamber and a removable seal that separates said first and second chambers from each other, said second chamber holding therein a second fluid;
interconnection means for connecting said syringe to said first chamber of said processing chamber for establishing a communication between said first syringe and said processing chamber such that said first fluid is allowed to flow from said syringe to said first chamber of said processing chamber; and actuation means provided on said base member for actuating said syringe wherein said syringe block and said cell block are detachable in an environment where said processing is conducted.

16. An apparatus for processing a material as claimed in claim 15 in which said cell block carries thereon observation window means for allowing an observation of an interior of said processing chamber.

* * * * *